United States Patent [19]

Etoh et al.

[11] Patent Number: 4,965,769

[45] Date of Patent: Oct. 23, 1990

[54] SEMICONDUCTOR MEMORY CAPABLE OF HIGH-SPEED DATA ERASING

[75] Inventors: Jun Etoh; Kiyoo Itoh, both of Tokyo; Masakazu Aoki, Saitama; Ryoichi Hori, Tokyo, all of Japan

[73] Assignee: Hitachi, Ltd., Tokyo, Japan

[21] Appl. No.: 278,025

[22] Filed: Nov. 30, 1988

[30] Foreign Application Priority Data

Dec. 4, 1987 [JP] Japan .................. 62-305638

[51] Int. Cl.[5] .......................................... G11C 11/409
[52] U.S. Cl. .................. 365/218; 365/149; 365/177
[58] Field of Search ............ 365/218, 189.09, 177, 365/149, 203; 307/499

[56] References Cited

U.S. PATENT DOCUMENTS

| | | | |
|---|---|---|---|
| 4,584,670 | 4/1986 | Michael | 365/149 |
| 4,587,629 | 5/1986 | Dill et al. | 365/218 X |
| 4,593,382 | 6/1986 | Fujishima et al. | 365/149 |
| 4,680,734 | 7/1987 | Baba et al. | 365/149 X |
| 4,799,193 | 1/1989 | Horiguchi et al. | 365/149 |
| 4,813,020 | 3/1989 | Iwamura et al. | 365/189.09 |
| 4,839,865 | 6/1989 | Sato et al. | 365/189.09 X |

OTHER PUBLICATIONS

Kawamoto et al., "A 288K CMOS Pseudostatic RAM", IEEE Journal of Solid-State Circuits, vol. SC-19, No. 5, Oct. 1984, pp. 619-623.

Primary Examiner—Stuart N. Hecker
Assistant Examiner—Andrew L. Sniezek
Attorney, Agent, or Firm—Fay, Sharpe, Beall, Fagan, Minnich & McKee

[57] ABSTRACT

A semiconductor memory having a plurality of word lines, and a plurality of data lines arranged to intersect the word lines. Memory cells are arranged at nodes of the word lines and the data lines. Each of the memory cells has a field effect transistor and a capacitor. A word line multiple selection circuit is provided for selecting a plurality of the word lines. The multiple selection circuit simultaneously accesses all of the memory cells by selecting all the word lines of a memory array when a semiconductor memory is in a clear mode. In the clear mode a detector selects data lines of the memory array. A plate voltage control circuit controls a voltage at one plate of each of the capacitors in the memory cells. The plate control circuit changes a voltage at the plate to a preselected clear mode voltage when a semiconductor memory is in a clear mode. It is a feature of the invention that preselected data is written in the memory cells by data communication through the data lines during the clear mode. The preselected data includes at least one "1" data of the preselected data written in the memory cells. Subsequently to end the clear mode operation, the plate voltage control circuit changes the plate voltage for normal operations.

23 Claims, 8 Drawing Sheets

SEMICONDUCTOR MEMORY CAPABLE OF HIGH-SPEED DATA ERASING

BACKGROUND OF THE INVENTION

The present invention relates to a semiconductor memory, especially a DRAM (Dynamic Random Access Memory) and, more particularly, to a circuit architecture suitable for reducing the operating time of the so-called "clear mode" by writing predetermined data in all memory cells which erase the data of all memory cells. Thus, by "clear mode" is meant a data change in all memory cells in an array.

In recent years, the DRAM has had its applications extended to graphics systems. The memory for this application frequently accomplishes the so-called "clear mode". In the memory of the prior art, however, the write and read of the data are accomplished bit by bit. At present, the DRAM of this type is a mainstream. In case the clear mode operation is requested, such memory is required sequentially to write predetermined data at each bit so that the clear mode operation takes a long time. In the case of the DRAM of 1 Mbits, for example, the time for the clear mode operation is about 0.2 seconds if the cycle time is 200 nanoseconds. Thus, the time for the clear mode operation has been a problem with prior art memory. The art relating to the device of this kind is disclosed in IEEE Journal Solid-State Circuits, Vol. SC-19, No. 5 (1984), pp. 619 to 623, for example.

SUMMARY OF THE INVENTION

For the request of the clear mode operation, as described above, the memory of the prior art is required to write the predetermined data at each bit and accordingly to take a long time for the clear mode operation. The prior art thus has the defect that the system performance is degraded.

The present invention can be achieved by providing: a circuit for multiple selection of word lines for a period of clear mode operation, a circuit for multiple selection of data lines; and a control circuit for the application of a voltage of one plate of the capacitor of a memory cell consisting of one insulated gate field effect transistor and the capacitor.

The circuit used for multiple selection of word lines drives all the word lines in substantially the same time to select all the memory cells. The circuit for multiple selection of the data lines selects all the data lines in substantially the same time to enable all the memory cells to write predetermined data at one time through the data lines. The control circuit for controlling a voltage at the one plate of the capacitor comprising the memory cell boosts the higher one of the voltages, which are written through the data lines, to a necessary level. Thus, the memory data of all the memory cells can be rewritten at one time so that the time for the clear mode operation can be remarkably reduced.

An object of the present invention is to provide a memory for reducing the time for the clear mode operation.

Another object of the present invention is to provide a memory having stable operations.

Still another object of the present invention is to provide a memory capable of accomplishing the clear mode operation with less power consumption.

These and other objects and many of the attendant advantages of the present invention will become readily appreciated as the same becomes better understood by reference to the following detailed description when considered in connection with the accompanying drawings.

DETAILED DESCRIPTION OF THE INVENTION Embodiment 1

Figure 1A:
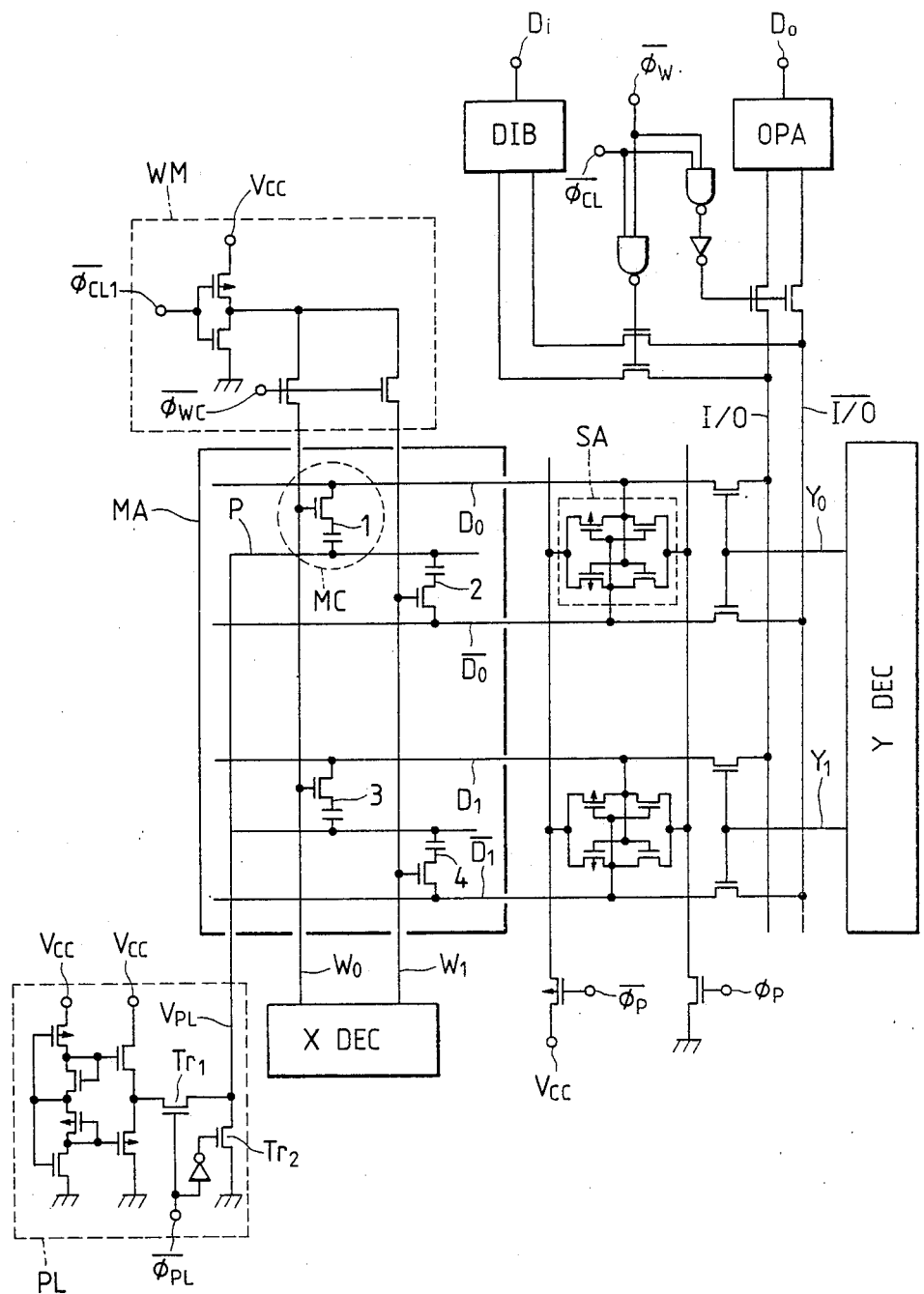
FIG. 1(a) is a circuit diagram showing a first embodiment of the present invention.

A first embodiment of the present invention will be described in the following with reference to FIGS. 1(a)–(e). FIG. 1(a) shows a major circuit of the memory of the present invention. Here arrowed insulated gate field effect transistors, especially MoS-FETs are of the P-channel type, and other insulated gate field effect transistors, especially MOS-FETs are of the N-channel type. A memory array MA is composed of word lines $W_0$ and $W_1$, data lines $D_0$, $\overline{D}_0$, $D_1$ and $\overline{D}_1$, and a memory cell MC. A plate P forming one end of the capacitor comprising the memory cell is let to the outside of the memory array and connected to a plate voltage control circuit PL. The word line has its one end connected to an X-decoder XDEC and its other end connected to a word line multiple selection circuit WM. In normal operations, the X-decoder drives one of the word lines. In the clear mode operations, the word line multiple selection circuit WM drives all the word lines at substantially the same time. With each pair of data lines there is connected a sense-amplifier SA for amplifying a memory cell signal. A Y-decoder YDEC has its output node connected to a switching gate between the data line and common data lines I/O and $\overline{I/O}$ (which may be separated at the input and output sides). The Y-decoder selects one pair of data lines in the normal operations and selects all the data line pairs in the clear mode operations. This Y-decoder can be constructed of the circuit shown in FIG. 1(c), for example. If the clear mode is entered in FIG. 1(c), a clear mode control signal $\overline{\phi}_{CL}$ takes a low level to raise all Y-decoder output signals $Y_0$ to $Y_7$ to a high level independently of Y-address signals $a_{y0}(\overline{a}_{y0})$ to $a_{y2}(\overline{a}_{y2})$. As a result, the data lines are multiply selected. Incidentally, in a normal operation, the $\overline{\phi}_{CL}$ takes the high level so that one of the Y-decoder output signals $Y_0$ to $Y_7$ takes the high level in response to a Y-address signal.

To the common data lines, there are connected through a switching gate a data output-amplifier OPA and a data input buffer DIB (FIG. !(a)). In the clear mode operations, the common data lines and the data output-amplifier OPA are cut, and the data input-buffer DIB is connected. As a result the data to be written in all the memory cells is latched.

Figure 1B:
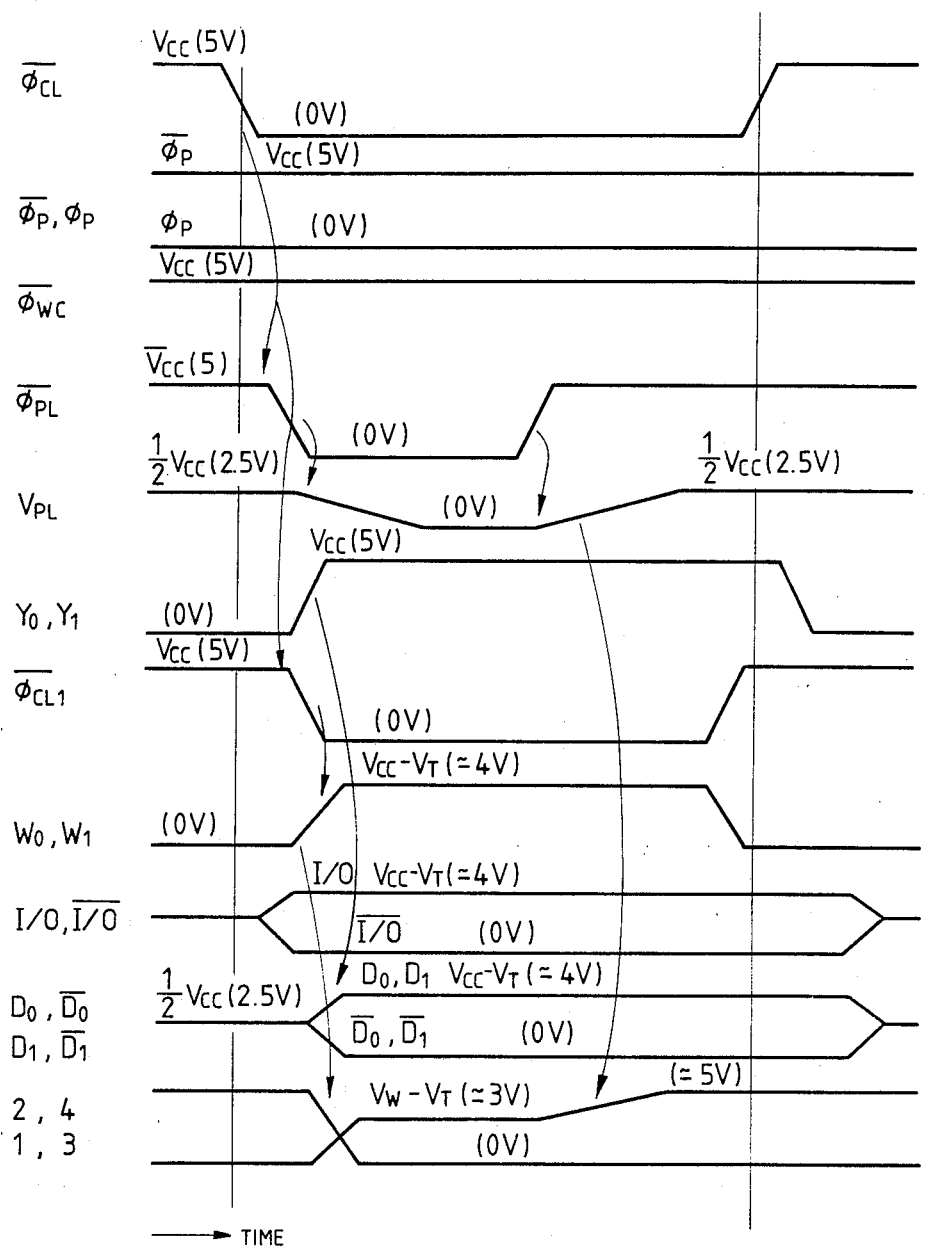
FIG. 1(b) is a waveform chart showing the operations of the first embodiment.
Figure 1C:
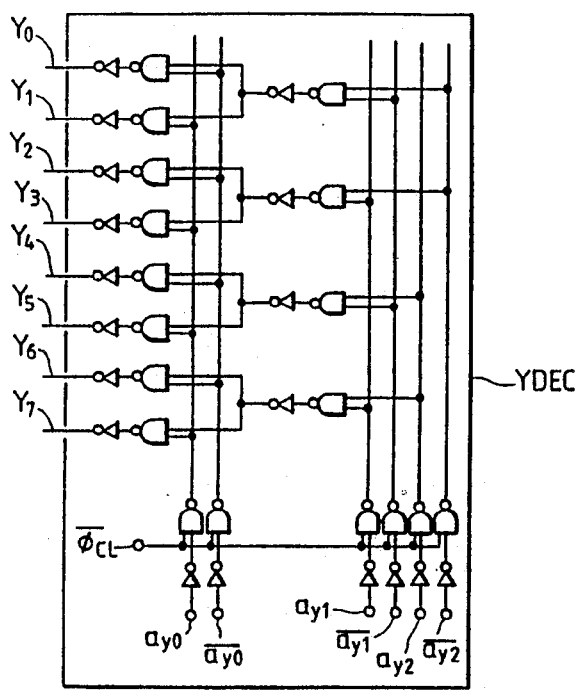
FIG. 1(c) is a circuit diagram showing a Y-decoder of the first embodiment.

The operations of the circuit shown in FIG. 1(a) will be described with reference to the operating waveforms of FIG. 1(b). When the clear mode is entered, the clear mode control signal $\overline{\phi}_{CL}$ takes the low level. This signal $\overline{\phi}_{CL}$ is at the low level during the clear mode. Sense-amplifier drive signals $\overline{\phi}_p$ and $\phi_p$ take the high and low levels, respectively, while the control signal $\overline{\phi}_{CL}$ is at the low level to turn off the sense-amplifier. When the control signal $\overline{\phi}_{CL}$ takes the low level, a plate voltage control signal $\overline{\phi}_{PL}$ takes the low level so that a transistor $T_{r1}$ is turned off whereas a transistor $T_{r2}$ is turned on. The plate voltage control circuit PL drops an output voltage $V_{PL}$ from $V_{CC}/2$ to 0 V. As a result the voltage of the plate P drops to 0 V. Next, when the control signal $\overline{\phi}_{CL}$ takes the low level, a word line multiple selection control signal $\overline{\phi}_{L1}$ takes the low level and a word clear signal $\overline{\phi}_{WC}$ takes the high level so that the word line multiple selection circuit WM drives all the word lines $W_0$ and $W_1$ from 0 V to a level of $(V_{CC}-V_T)$ ($V_T$ is threshold voltage of N-channel MOSFET). As a result, all the memory cells are selected. Incidentally, for normal operations the $\overline{\phi}_{CL1}$ takes the high level, the $\overline{\phi}_{WC}$ takes the high level for the memory standby period and takes the low level for the operating period. As a result the word line potential is kept at the low level for the standby period. The Y-decoder raises all the output signals $Y_0$ and $Y_1$ to the high level, while the control signal $\overline{\phi}_{CL}$ is at the low level, as has been described above, to connect all the data lines $D_0$, $\overline{D}_0$, $D_1$, and $\overline{D}_1$ and the common data lines I/O and $\overline{I/O}$. On the other hand, the control signal $\overline{\phi}_{CL}$ connects the common data lines I/O and $\overline{I/O}$ and the data input buffer DIB. As a result, the data Di to be written in all the memory cells are written in all the memory cells through the data input buffer DIB, the common data lines I/O and $\overline{I/O}$, and the data lines $D_0$, $\overline{D}_0$, $D_1$, and $\overline{D}_1$. Since, at this time the word lines $W_0$ and $W_1$ have a voltage $V_W$ at $(V_{CC}-V_T)$ ($\approx 4$ V), the data to be written in the memory cells take the high level of $(V_W-V_T)$ ($\approx 3$ V) and the low level of 0 V. If the control signal $\overline{\phi}_{PL}$ is then raised to the high level, the plate voltage control circuit PL raises the output voltage from 0 V to $V_{CC}/2$. As a result, the voltage of the plate P changes from 0 V to $V_{CC}/2$. As a result, the voltages of storage nodes 1 and 3 of the memory cell written with the high level rise from $\approx 3$ V to $\approx 5$ V. On the contrary, the voltages of storage nodes 2 and 4 of the memory cell written with the low level remain at 0 V because the nodes 2 and 4 are connected to the data lines $\overline{D}_0$ and $\overline{D}_1$. After this, the control signal $\overline{\phi}_{CL1}$ takes the high level so that all the word lines $W_0$ and $W_1$ take the low level. At this time the write of the data in all the memory cells is ended. As a result the memory cells are stored with $\approx 5$ V as the high level data and 0 V as the low level data. When the clear mode is then ended the control signal $\overline{\phi}_{CL}$ takes the high level. As a result the Y-decoder output signals $Y_0$ and $Y_1$ take the low level. Moreover, the memories come into the standby operations, and the common data lines I/O and $\overline{I/O}$, and the data lines $D_0$, $\overline{D}_0$, $D_1$, and $\overline{D}_1$ come into the precharge operations. By the operations described above all the memory cells are written with the predetermined data and the erasure of all the storage data is ended.

Figure 1D:
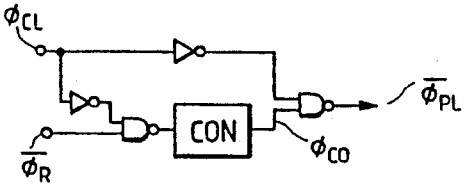
FIG. 1(d) is a circuit diagram showing a timing pulse generating circuit of the first embodiment.
Figure 1E:
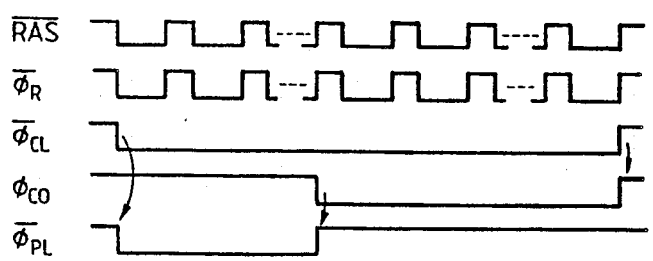
FIG. 1(e) is a waveform chart showing the operations of the timing pulse generating circuit.

Incidentally, the circuit architecture of the present invention can write the data in all the memory cells at one time. Considering a peak power supply current, however, it takes several to several tens of microseconds to change the voltage of the plate P having a large capacitance of several hundreds of pF. This means, if the operating cycle period ($\approx 200$ nanoseconds) of the normal memory is considered, that the clear mode operations require several tens of cycles. As a result the clear mode control signal $\overline{\phi}_{CL}$ extends over several cycles. This signal can be formed by combining external memory control signals $\overline{RAS}$, $\overline{CAS}$, and $\overline{WE}$ and an address signal Ai as in the CAS before RAS refresh mode, for example. If a set signal and a reset signal are formed by the aforementioned combination, it is possible to form a signal which holds the Low (or High) level over several cycles. The timings of these set and reset signals can be determined by the transition timing of the $\overline{RAS}$ signal. Moreover, the plate voltage control signal $\overline{\phi}_{PL}$ and the word line multiple selection control signal $\phi_{CL1}$ formed in response to the control signal $\phi_{CL}$ also extend several cycles and can be formed by the circuit shown in FIG. 1(d). FIG. 1(d) shows a $\overline{\phi}_{PL}$ generating circuit which is constructed of a counter CON and a logical gate for controlling the input and output signal of the counter CON. The operations of this circuit will be described with reference to the operating waveforms of FIG. 1(e). When the control signal $\overline{\phi}_{CL}$ takes the Low level, the output $\phi_{PL}$ takes the Low level so that the counter CON starts the counting operation of a signal $\overline{\phi}_R$. When a predetermined count is reached the output $\phi_{CO}$ of the counter takes the Low level so that the output $\overline{\phi}_{PL}$ takes the High level. When the control signal $\overline{\phi}_{CL}$ then takes the High level the counter is reset to raise its output $\phi_{CO}$ to the High level and the output $\overline{\phi}_{PL}$ is caused to hold the High level in response to the control signal $\phi_{CL}$. Thus, the signals $\overline{\phi}_{PL}$ and $\overline{\phi}_{CL1}$ can be easily formed by using the circuit of FIG. 1(d).

As has been described hereinbefore, according to the present embodiment, the predetermined data can be written at one time in all the memory cells so that the time period for the clear mode operations can be reduced from several hundreds of milliseconds (in the case of the DRAM of 1 Mbits), as required by the prior art, to several tens of microseconds. This makes it possible to improve the performance of the system using the present memory. In the clear mode operations, moreover, the data to be written in all the memory cells are inputted though the data input buffer so that they can be selected by the user. As a result, the flexibility of designing the system is increased. Since, furthermore, the data are written through the data input buffer and the common data lines, it is possible to logically write the data "1" or "0" in the memory cells. The circuit for multiple selection of the word lines intrinsically employs the circuit for holding the word lines at the Low level for the standby period so that it can be formed without any increase in the chip size.

Embodiment 2

Figure 2:
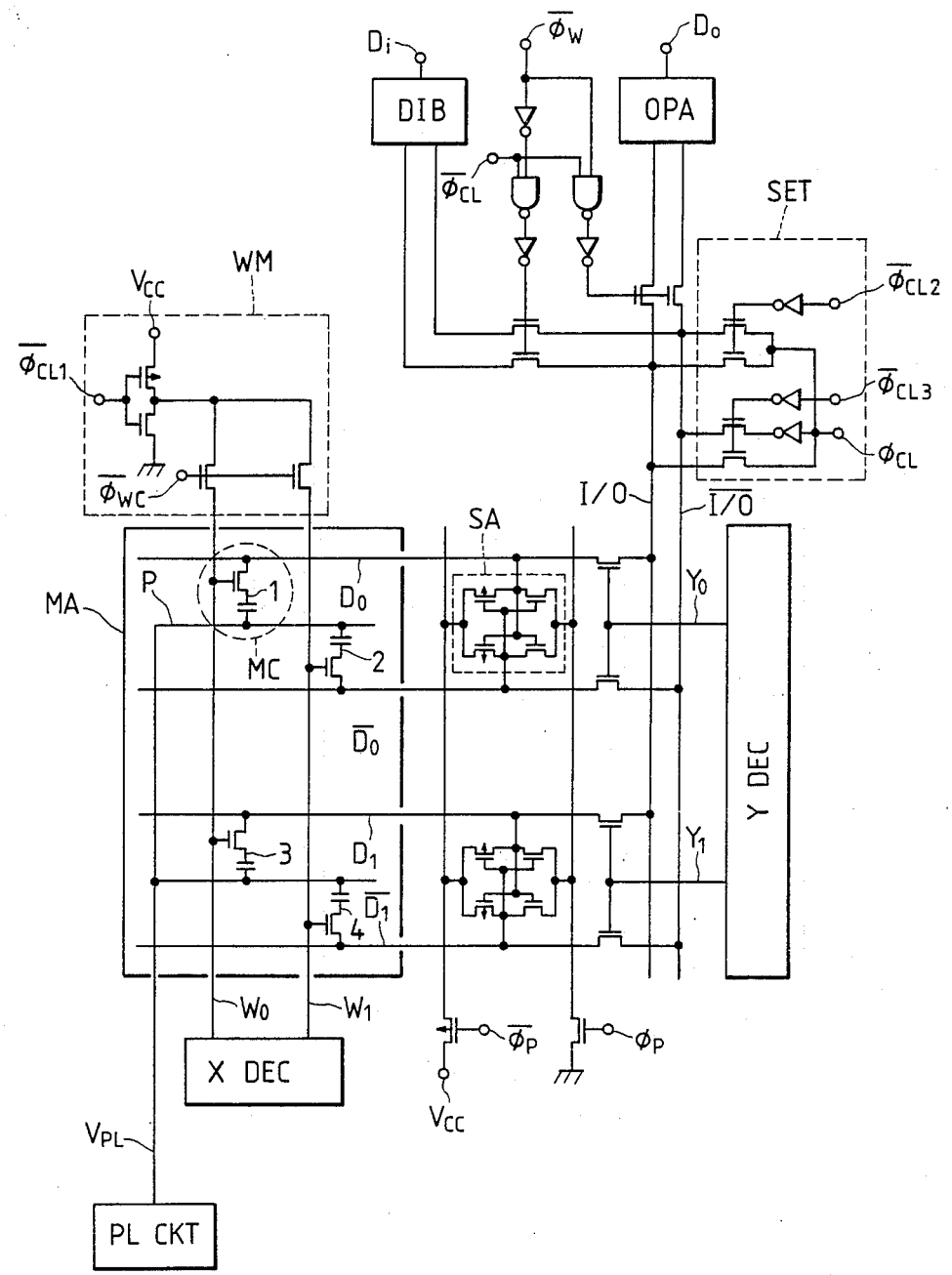
FIG. 2 is a circuit diagram showing a second embodiment of the present invention.

A second embodiment of the present invention will be described with reference to FIG. 2. The present embodiment is identical to the first embodiment except that the data be to written in the memory cells in the clear mode operations are formed by a data-set circuit (SET) formed in a chip. Therefore, the circuit structure shown in FIG. 2 is identical to that of the first embodiment shown in FIG. 1 except that the data-set circuit SET for forming the data to be written in the clear mode operations is connected to the common data lines I/O and $\overline{I/O}$. Moreover the operations are identical to those of the first embodiment except that of the data-set circuit and those of the switching gate between the common data lines, the data output amplifier OPA, and the data input buffer DIB.

The present embodiment will be described by stressing the circuit structure and operations of the data-set circuit SET. In response to the control signals $\phi_{CL}$ and $\overline{\phi}_{CL}$, the data-set circuit forms data having all their bits at (logical) "1" or "0", as viewed from the outside of the chip. In response to the control signals $\phi_{CL}$ and $\phi_{CL2}$, the data-set circuit forms data having all their bits at (physical) "1" or "0", as viewed from the storage nodes of the memory cells. The operation of this circuit will be described as follows. In the clear mode operations, as the clear mode control signal $\overline{\phi}_{CL}$ goes to the Low level, (1) all the sense amplifiers are off; (2) the plates P of the memory cell have the voltage of 0 V; (3) all the word lines $W_0$ and $W_1$ take the High level of $(V_{CC}-V_T)$; and all the Y-decoder output signals $Y_0$ and $Y_1$ take the High level as has been described in the first embodiment. As a result, all the memory cells are ready for writing the data. Here, in view of the relationship between the common data lines I/O, $\overline{I/O}$, and the data output amplifier OPA, the data input buffer DIB, the control signal $\overline{\phi}_{CL}$ takes the Low level so that all the circuits are isolated from the common data lines. Thus, in response to the control signal $\overline{\phi}_{CL2}$ or $\overline{\phi}_{CL3}$ at the Low level the data from the data set circuit SET are written in the memory cells. Here, if the signal $\overline{\phi}_{CL2}$ is at the High level, and the signal $\overline{\phi}_{CL3}$ is at the Low level, and if the signal $\phi_{CL}$ is at the Low level, the logical "0" data (as assumed to be at the Low level) are written in all the bits. If, on the other hand, the signals $\overline{\phi}_{CL2}$, $\overline{\phi}_{CL3}$ and $\phi_{CL}$ are at the Low, High, and Low levels, respectively, the physical "0" data are written in all the bits. After the data have been written in the memory cells by the operations described above, the clear mode is ended by the operations similar to those of the first embodiment. Now, in the present embodiment, the data to be written in the memory cells in the clear mode operations are determined by the logical combination of the signals $\overline{\phi}_{CL2}$, $\overline{\phi}_{CL3}$, and $\phi_{CL}$. The level of this signal can be prepared like the signal $\phi_{CL}$ by the logical combination of the external control signals $\overline{RAS}$, $\overline{CAS}$, and $\overline{WE}$ of the memory and the address signal Ai.

As has been described hereinbefore, according to the present embodiment, the operating time in the clear mode can be reduced, and the data (of logical and physical forms) to be written in the clear mode can be freely selected. This increases the flexibility of the system design by the user. The circuit architecture of the present embodiment reduces the test time of the memory. This is because the present embodiment can easily write the physical data.

Embodiment 3

Figure 3:
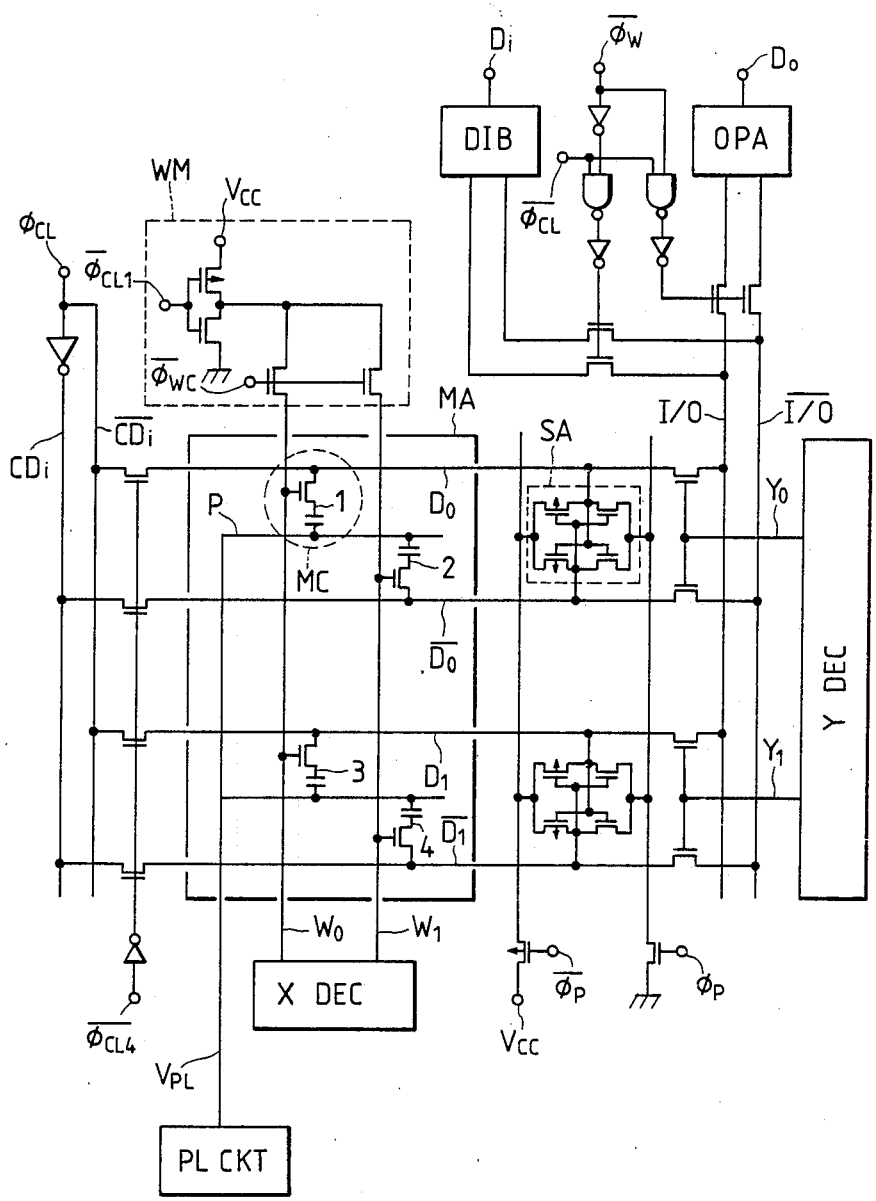
FIG. 3 is a circuit diagram showing a third embodiment of the present invention.

A third embodiment of the present invention will be described with reference to FIG. 3. The present embodiment is identical in its circuit structure and operations to the first embodiment except that the data to be written in the memory cells in the clear mode operations are written in the memory cells through special data input lines CDi and $\overline{CDi}$.

The present embodiment will be described by stressing the special data input lines CDi and $\overline{CDi}$. These data input lines CDi and $\overline{CDi}$ are connected to the data lines through a switching gate which is controlled by a signal $\overline{\phi}_{CL4}$. In the clear mode operations, as the clear mode control signal $\overline{\phi}_{CL}$ goes to the Low level, (1) all the sense amplifiers are off; (2) the plates P of the memory cells take 0 V; and, (3) all the word lines $W_0$ and $W_1$ take the High level of $(V_{CC}-V_T)$, as has been described in the first embodiment. At this time, the common data lines I/O and $\overline{I/O}$, the data output amplifier OPA, and the data input buffer DIB are isolated. If the signal $\overline{\phi}_{CL4}$ is then dropped to the Low level, the memory cells are written with the data responding to the control signal $\phi_{CL}$. After this, the clear mode is ended by the operations similar to those of the first embodiment. Here, the data to be written in the memory cells are the signal $\phi_{CL}$ in the description made above. However, the data latched in the data input buffer can be used by connecting the special data input lines CDi and $\overline{CDi}$ and the data input buffer.

As has been described hereinbefore, according to the present invention, the operating time in the clear mode can be reduced so that the system using the present memory can have its performance improved. Since, moreover, the special data input lines are used, the Y-decoder need not be used for the multiple selection so that the design of the memory circuit can be simplified. If, still moreover, the special data input lines are made into a circuit structure for selections in response to the signals of the Y-decoder, it is possible to construct a memory which can operate separately at input and output sides in the normal operations.

Embodiment 4

Figure 4:
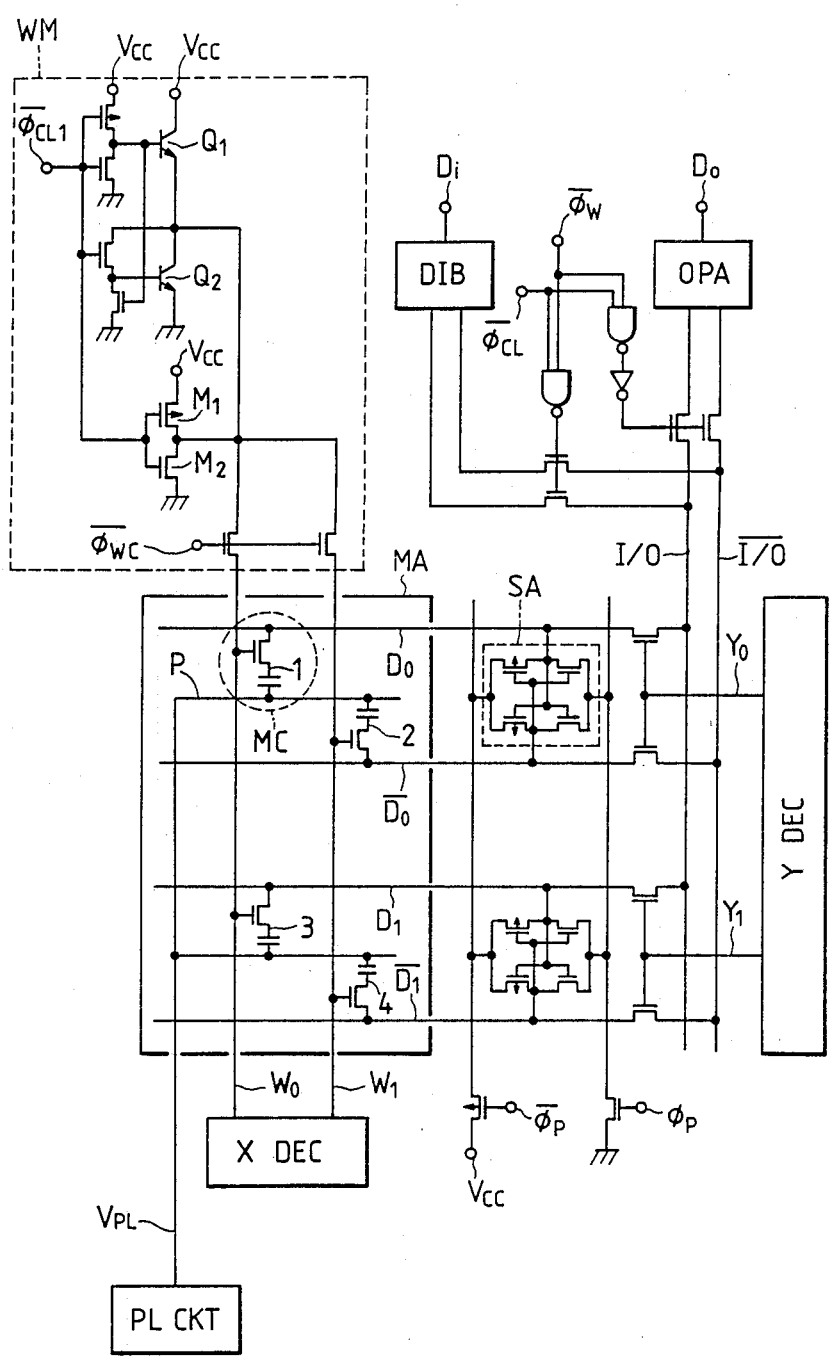
FIG. 4 is a circuit diagram showing a fourth embodiment of the present invention.

A fourth embodiment of the present invention will be described with reference to FIG. 4. The present embodiment has its word line multiple selection circuit constructed of bipolar transistors and MOS-FETs, but its remaining circuit structure and operations are identical to those of the first embodiment. The present word line multiple selection circuit will operate, as follows. When the clear mode is entered, the signal $\overline{\phi}_{WC}$ takes the High level, and the signal $\overline{\phi}_{CL1}$ takes the Low level, as has been described in the first embodiment. If the signal $\overline{\phi}_{CL1}$ takes the Low level, a transistor $Q_1$ is turned on; a transistor $Q_2$ is turned off; a transistor $M_1$ is turned on; and a transistor $M_2$ is turned off. As a result, the transistors $Q_1$ and $M_1$ charge the word lines $W_0$ and $W_1$ to High level of $(V_{CC}V_T)$ After this, as has been described in the first embodiment, the voltages of the memory cells written with the High level are boosted by the plate voltage control circuit. After this the signal $\overline{\phi}_{CL1}$ takes the High level. When the signal $\overline{\phi}_{CL1}$ takes the High level, the transistor $Q_1$ is turned off; the transistor $Q_2$ is turned on; the transistor $M_1$ is turned off; and the transistor $M_2$ is turned on. As a result, the word lines $W_0$ and $W_1$ are discharged to the Low level (at 0 V), thus ending the writing operations.

As has been described hereinbefore, according to the present embodiment, the work line multiple selection circuit is constructed of the bipolar transistors having a high drivability so that the layout area can be reduced, as compared with the case in which the multiple selection circuit is constructed of the MOS-FETs only. This makes it possible to suppress the increase in the chip size.

Embodiment 5

Figure 5:
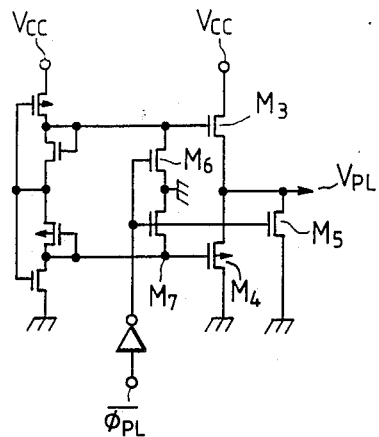
FIG. 5 is a circuit diagram showing a fifth embodiment of the present invention.

A fifth embodiment of the present invention will be described with reference to FIG. 5. The present embodiment is a modification of the plate voltage control circuit. The plate voltage control circuit PL described in the first embodiment is constructed such that the MOS-FET $Tr_1$ to be controlled by the plate voltage control signal $\bar{\phi}_{PL}$ is disposed at the output node. As a result, in the normal operations (at the output voltage of $V_{PL} = V_{CC}/2$), as the aforementioned MOS-FET $Tr_1$ acts as a resistor, the plate voltage control circuit described in the first embodiment increases the voltage fluctuations of the plate. This problem is solved by the present embodiment in which the signal $\bar{\phi}_{PL}$ controls transistors $M_3$ and $M_4$ at the output stage. In case the signal $\bar{\phi}_{PL}$ is at the High level in the normal operations, transistors $M_6$ and $M_7$ are off so that the output voltage $V_{PL}$ takes the level of $V_{CC}/2$. In the clear mode operations, as the signal $\bar{\phi}_{PL}$ goes to the Low level, the transistors $M_6$ and $M_7$ are turned on so that the transistor $M_3$ is turned off; the transistor $M_4$ is turned on; and a transistor $M_5$ is turned on. As a result, the output voltage $V_{PL}$ takes the voltage of 0 V. When the signal $\bar{\phi}_{PL}$ is then returned to the High level, the output voltage $V_{PL}$ restores the level of $V_{CC}/2$. As has been described hereinbefore, according to the present embodiment, the fluctuations of the plate voltage can be suppressed because the output voltage $V_{PL}$ is controlled by the output stage transistors $M_3$ and $M_4$. This provides upgraded system performance.

Embodiment 6

Figure 6:
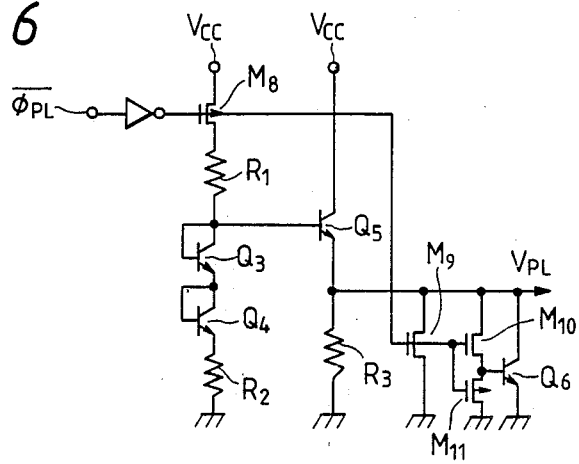
FIG. 6 is a circuit diagram showing a sixth embodiment of the present invention.

A sixth embodiment of the present invention will be described with reference to FIG. 6. The present embodiment is a modification of the plate voltage control circuit. This modified circuit is constructed by the combination of bipolar transistors and MOS-FETs. In case the signal $\bar{\phi}_{PL}$ is at the High level in the normal operations, a transistor $M_8$ is turned on; a transistor $M_9$ is turned off; and the transistor $Q_6$ is turned off so that the output voltage $V_{PL}$ is caused to take the level of $V_{CC}/2$ by resistors $R_1$ and $R_2$ and the transistors $Q_3$, $Q_4$ and $Q_5$. In the clear mode operations, as the signals $\bar{\phi}_{PL}$ goes to the Low level, the transistor $M_8$ is turned off; the transistor $M_9$ is turned on; and the transistor $Q_6$ is turned on so that the output voltage $V_{PL}$ takes 0 V. When the signal $\bar{\phi}_{PL}$ is then returned to the High level, the output voltage $\bar{\phi}_{PL}$ restores the level of $V_{CC}/2$. Thus, in the present embodiment, the output voltage $V_{PL}$ is controlled by using the bipolar transistors having a high drivability so that the time for changing the plate voltage can be reduced. As a result, the plate voltage control circuit in this embodiment can reduce the time for the clear mode. It improves the performance of the system.

Embodiment 7

Figure 7A:
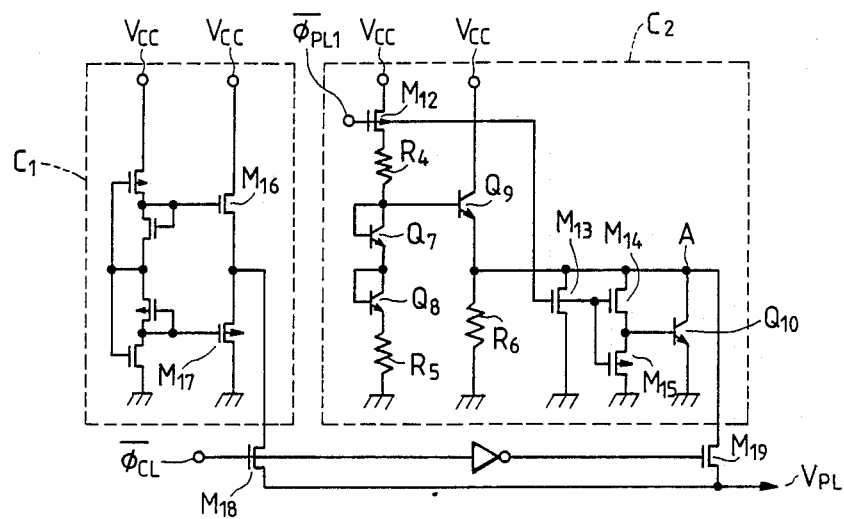
FIG. 7(a) is a circuit diagram showing a seventh embodiment of the present invention.
Figure 7B:
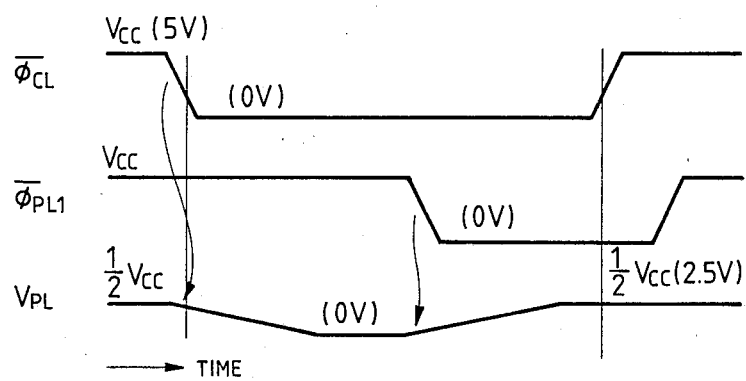
FIG. 7(b) is a waveform chart showing the operations of the circuit shown in FIG. 7(a); and, FIG. 8 is a circuit diagram showing an eighth embodiment of the present invention.

A seventh embodiment of the present invention will be described with reference to FIG. 7. The present embodiment is a modification of the plate voltage control circuit. This plate voltage control circuit is constructed of: a plate voltage control circuit $C_1$ composed of MOS-FETs; and a plate voltage control circuit $C_2$ composed of bipolar transistors and MOS-FETs. The plate voltage is fed by the circuit $C_1$ in the normal operations and by the circuit $C_2$ in the clear mode operations. The operations of these circuits will be described with reference to the operating waveforms of FIG. 7(b). In case, in the normal operations, the clear mode control signal $\bar{\phi}_{CL1}$ is at the High level and the plate voltage control signal $\bar{\phi}_{PL1}$ is at the High level, a transistor $M_{18}$ is turned on, and a transistor $M_{19}$ is turned off. As a result, the plate voltage $V_{PL}$ is caused to take the level of $V_{CC}/2$ by the circuit $C_1$. Since, at this time, the signal $\bar{\phi}_{PL1}$ is at the High level, transistors $M_{12}$ and $M_{13}$ in the circuit $C_2$ are turned off and on, respectively, so that an output node A takes the Low level. In the clear mode operations, as the signal $\bar{\phi}_{CL}$ goes to the Low level, the transistor $M_{18}$ is turned off, and the transistor $M_{19}$ is turned on. As a result, the charges of the plate are discharged through the transistor $M_{13}$ and $Q_{10}$ so that the plate voltage $V_{PL}$ takes the level of 0 V. When the signal $\bar{\phi}_{PL1}$ then takes the Low level, the transistors $M_{12}$, $M_{13}$ and $Q_{10}$ are turned on, off and off, respectively, so that the plate voltage $V_{PL}$ rises to the level of $V_{CC}/2$. When the signal $\bar{\phi}_{CL}$ is returned to the High level, the transistor $M_{18}$ is turned on, and the transistor $M_{19}$ is turned off. As a result, the plate voltage $V_{PL}$ is caused to hold the voltage of $V_{CC}/2$ by the circuit $C_1$. After this, the signal $\bar{\phi}_{PL1}$ takes the High level to drop the node A to 0 V.

As has been described above, in the present embodiment, the plate voltage is fed in the clear mode operations by the circuit $C_2$ composed of the bipolar transistors and the MOS-FETs so that the time for changing the plate voltage can be reduced. As a result, the plate voltage control circuit in this embodiment can reduce the time for the clear mode operations. It improves the performance of the system. In the normal operations, moreover, the plate voltage can be fed by the circuit $C_1$ composed of the MOS-FETs. At this time, the circuit $C_2$ is off, to eliminate the current through transistors $M_{12}$, $Q_7$, $Q_8$ and resistors $R_4$, $R_5$. As a result, it is possible to reduce the power consumption of the memory.

Embodiment 8

Figure 8:
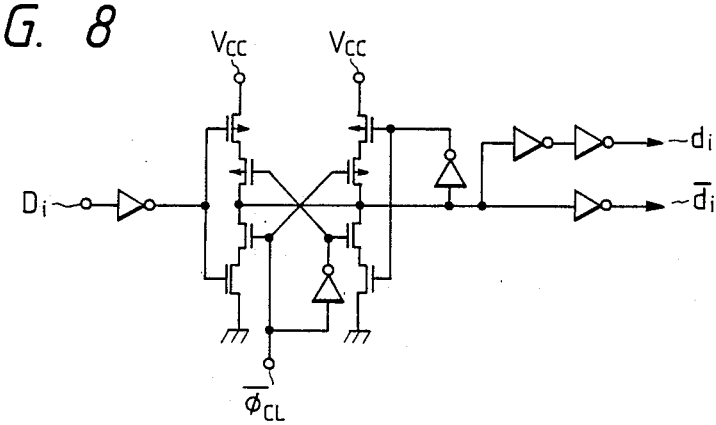

An eighth embodiment of the present invention will be described with reference to FIG. 8. FIG. 8 shows a data input buffer. In the normal operations, this circuit forms internal data di and $\overline{di}$ in response to input data Di. In the clear mode, the circuit latches the input data Di, when the clear mode control signal $\bar{\phi}_{CL}$ transits to the Low level, to use them as the internal data di and $\overline{di}$. This status is held while the signal $\bar{\phi}_{CL}$ is at the Low level. According to the present embodiment, as the input data are latched, it is unnecessary to hold the input data from the outside of the chip during the clear mode operations. Therefore, the data input buffer in this embodiment increases the flexibility of the system design.

Since, according to the present invention, the predetermined data can be written in all the memory cells at one time, the clear mode operating time of several hundreds of milliseconds required by the prior art can be reduced to several to several tens of microseconds. As a result, the performance of the system using the present memory can be improved. According to the present invention, moreover, it is possible to reduce the power consumption for erasing all the data at one time.

It is further understood by those skilled in the art that the foregoing description is directed to the preferred embodiments of the disclosed invention and that various changes and modifications may be made in the invention without departing from the spirit and scope thereof.

Having thus described the invention, it is now claimed:

1. A semiconductor memory comprising:
   a plurality of word lines;
   a plurality of data lines arranged to intersect said word lines;
   memory cells arranged at nodes of said word lines and said data lines and each having a field effect transistor and a capacitor;
   first means for selecting a plurality of said word lines, wherein the first means simultaneously accesses all the memory cells by selecting all word lines of an array when the semiconductor memory is in clear mode;
   second means for selecting a plurality of said data lines;
   plate voltage control means for controlling a voltage at one plate of each of the capacitors in said memory cells, wherein the plate voltage control means changes a voltage at the plate to a preselected clear mode voltage when the semiconductor memory is in clear mode and subsequently changes the plate voltage for normal operation at the end of the clear mode;
   writing means for writing preselected data in all the memory cells by data communication through the data lines during the clear mode, the preselected data being a logic "1" data, so as to complete the writing of a preselected data in the memory cells.

2. A semiconductor memory according to claim 1, wherein storage data is written in all the memory cells after said first means selects all the word lines and after said second means selects all the data lines.

3. A semiconductor memory according to claim 1, wherein said plate voltage control means provides a first potential before storage data is written in all the memory cells and provides a second potential corresponding to at least half supply voltage after said storage data has been written in all the memory cells.

4. A semiconductor memory according to claim 1, further comprising:
   a common data line electrically coupled commonly with at least two of said data lines; and
   set circuit means for inputting erasure data to said common data line in a clear mode operation.

5. A semiconductor memory according to claim 1, wherein said second means is logically constructed to select all the data lines in response to a logical gate controlled by a clear mode control signal.

6. A semiconductor memory according to claim 1, wherein said first means includes a circuit means for driving all the word lines in response to a clear mode control signal.

7. A semiconductor memory according to claim 6, wherein said first means includes at least two bipolar transistors and CMOS transistors.

8. A semiconductor memory according to claim 7, wherein said bipolar transistors and said CMOS transistors drive said word lines in parallel so that said bipolar transistors drive said word lines at a high speed and so that said CMOS transistors drive said word lines to voltages substantially equal to a supply voltage and a ground voltage.

9. A semiconductor memory according to claim 1, wherein said plate voltage control means includes a CMOS driver circuit.

10. A semiconductor memory according to claim 1, wherein said plate voltage control means includes a CMOS circuit and a bipolar transistor, and the emitter-collector current path of the bipolar transistor is electrically connected between a plate electrode and a ground line.

11. A semiconductor memory according to claim 1, wherein said plate voltage control means includes a first circuit for normal operations, and a second circuit for the clear mode operation.

12. A semiconductor memory according to claim 1, further comprising a data input buffer for receiving input data, wherein the input buffer includes latch means for fixing the input data for the clear mode operation wherein fixing the input data comprises holding in a predetermined manner data to be used during the clear mode operation.

13. A semiconductor memory according to claim 12, further comprising:
   a common data line connected commonly with at least two of said data lines; and
   a set circuit means for inputting erasure data to said common data line in a clear mode operation.

14. A semiconductor memory according to claim 12, wherein said second means is constructed in response to a first address decoder and logical gate controlled by a clear mode control signal, and
   wherein said first means includes a circuit means for driving all the word lines in response to a clear mode control signal.

15. A semiconductor memory according to claim 14, wherein said first means includes at least two bipolar transistors and CMOS transistors, and
   wherein said bipolar transistors and said CMOS transistors drive said word lines in parallel so that said bipolar transistors drive said word lines at a high speed and so that said CMOS transistors drive said word lines to voltages substantially equal to a supply voltage and a ground voltage.

16. A semiconductor memory according to claim 14, wherein said plate voltage control means includes a CMOS circuit and a bipolar transistor, and the emitter-collector current path of the bipolar transistor is electrically coupled between a plate electrode and a ground line.

17. A semiconductor memory according to claim 14, wherein said plate voltage control means includes a first circuit for normal operation, and a second circuit for the clear mode operation.

18. A semiconductor memory according to claim 6, further comprising:
   data input buffer means for receiving input data, wherein the input buffer means includes latch means for fixing the input data for the clear mode operation wherein fixing the input data comprises holding in a predetermined manner data to be used during the clear mode operation.

19. A semiconductor memory according to claim 1, wherein said plate voltage control means provides ground potential before the preselected data are written in all the memory cells, and provides a potential corresponding to at least half the supply voltage after said preselected data have been written in all the memory cells.

20. A method for simultaneously clearing data of a memory array, the memory array including a plurality of word lines, a plurality of data lines arranged to intersect said word lines, memory cells arranged at nodes of said word lines and said data lines and each having a field effect transistor and a capacitor, first means for selecting a plurality of said word lines, second means for selecting a plurality of said data lines, and plate voltage control means for controlling a voltage at one plate of each of the capacitors in said memory cells, the method comprising the steps of:

first simultaneously accessing all the memory cells by selecting all word lines of the array;

second changing a voltage at the plate to a preselected clear mode voltage;

third, simultaneously writing preselected data in the memory cells by data communication through the data lines when the plate is at the preselected clear mode voltage; and, fourth subsequently changing the plate voltage for normal array operation.

21. The method according to claim 20 wherein the first step is controlled by a clear mode control signal.

22. The method according to claim 21 wherein the preselected clear mode voltage is 0 V, and the plate voltage for normal operation is $\frac{1}{2}$ Vcc V.

23. The method according to claim 20 wherein the third step is completed after the first step and the second step, and the fourth step is completed after the third step.

* * * * *